United States Patent [19]

Kitamura et al.

[11] Patent Number: 5,502,323

[45] Date of Patent: Mar. 26, 1996

[54] LATERAL TYPE FIELD EFFECT TRANSISTOR

[75] Inventors: Akio Kitamura; Naoto Fujishima, both of Nagano, Japan

[73] Assignee: Fuji Electric Co., Ltd., Japan

[21] Appl. No.: 311,490

[22] Filed: Sep. 23, 1994

[30] Foreign Application Priority Data

Sep. 29, 1993 [JP] Japan .................................. 5-242267
Feb. 22, 1994 [JP] Japan .................................. 6-022930

[51] Int. Cl.⁶ .......................... H01L 29/76; H01L 29/94; H01L 31/062
[52] U.S. Cl. .......................... 257/335; 257/341; 257/401
[58] Field of Search ..................................... 257/401, 355, 257/336, 337, 341, 342, 343, 758, 335

[56] References Cited

U.S. PATENT DOCUMENTS 5,355,008  10/1994  Moyer et al. ........................... 257/401

OTHER PUBLICATIONS

"High–Efficiency Complementary Power Mos PWM Driver LSI with Low–Loss Full–Mode Snsing" by Kozo Sakamoto et al. IEEE 1992 Custom Integrated Circuits Conference, pp. 25.7.1–25.7.4.

Primary Examiner—Wael M. Fahmy
Attorney, Agent, or Firm—Parkhurst, Wendel & Rossi

[57] ABSTRACT

To widen the width of under layer wiring connected to a source region and to lower the resistance of the under layer wiring in a semiconductor device, a direction connecting a through hole with a contact hole connected to a drain region is tilted by 45 or by 30 over a direction connecting between contact holes for connecting a source region or the drain region. Alternatively, the source region and the a drain region are respectively aligned in parallel stripes, and the through hole and the contact hole for connecting the drain region are aligned in a stripe in which the drain region is aligned.

13 Claims, 5 Drawing Sheets

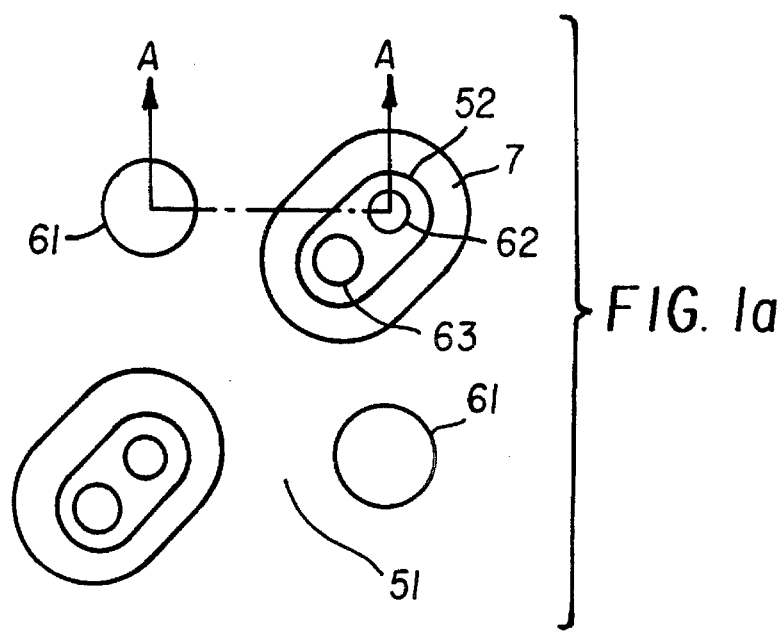
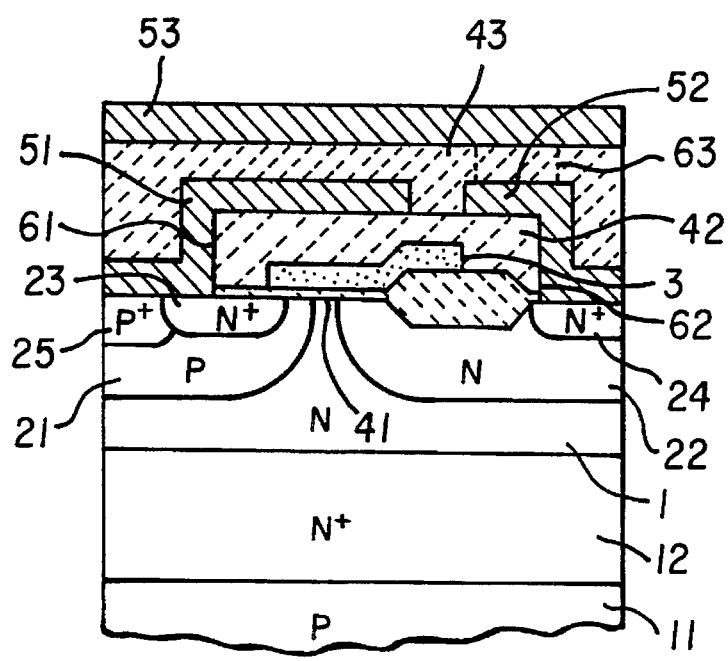
FIG. 1a
FIG. 1b

LATERAL TYPE FIELD EFFECT TRANSISTOR

FIELD OF THE INVENTION

The present invention relates to a lateral type field effect transistor used, for example, in an LSI for driving a small motor.

BACKGROUND

A lateral type field effect transistor (hereinafter referred to as FET), which includes source regions and drain regions located at lattice points and a gate electrode network surrounding the source regions and the drain regions, is disclosed by Sakamoto in the article entitled "High-Efficiency Complementary Power MOS PWM Driver LSI with Low-Loss Full-Mode Sensing" IEEE 1922 Custom IC Conference, 25.7.7 to 25.7.4, as a power MOSFET of low ON-resistance. FIGS. 2(a) and (b) show a conventional MOSFET, wherein FIG. 2(b) is a sectional view taken along B—B of FIG. 2(a) and shows an N+ source region 23 and an N+ drain region 24 are formed respectively in a P-type base region 21, which itself is formed with an N− drain region 22 in a surface layer of an N-type substrate 1. A gate electrode 3 is formed in a plane network on the surface between and above each N+ source region 23 and N+ drain region 24 through oxide gate film 41. Under layer Al wiring 51 contacts with the N+ source region 23 in a contact hole 61 disposed through insulative film 42 which covers the electrode 3. Under layer Al wiring 52 contacts with the N+ drain region 24 in a contact hole 62 disposed through the insulative film 42 which covers the electrode 3. The source side wiring 51 extends over the insulative film 42, and as an perspective plan view FIG. 2(a) shows, over the entire plane except the drain side wiring 52 and a gap 7. Upper layer Al wiring 53 contacts with the under layer Al wiring 52 in a through hole 63 disposed right above the contact hole 62 through inter-layer insulation film 43 which covers the under layer Al wiring 51. As FIG. 2(a) shows, the sources and the drains are formed on the lattice points one by the other. FIG. 3 is an expanded view showing an enlarged X portion of FIG. 2, the surface of which is covered with passivation film 44.

In a pMOSFET structure shown in FIGS. 4(a) and 4(b), a P+ source region 25 is formed directly in the surface of the n type substrate, and a P+ drain region is formed in a P− drain region formed in advance. In this pMOSFET, the through hole 63 for the drain side upper layer Al wiring 53 is displaced transversely from above the contact hole 62.

The structure shown in FIGS. 2 and 3 facilitates securing the width and the area of the under layer metal wiring 51 in a narrow space and reducing the resistance of the under layer metal wiring 51 since the upper layer wiring 53 contacts with the under layer wiring 52 in the through hole 63 disposed right above the contact hole 62. However, because the under layer metal wiring 52 which extends into the contact hole 62 is deformed as shown in FIG. 3, a part of the insulative layer 42 formed on the under layer wiring 52 is not etched off and left behind where it has been when the through hole 63 is formed. This causes a great increase of the resistance of the through hole. Even if the insulative layer 42 is completely etched off in that part, the through hole 63 becomes deeper than it should be to prevent the upper metal wiring 53 from extending into the through hole 63. In association with this, the resistance of the through hole greatly increases. And, in the worst case, the upper metal wiring 53 and the under metal electrode 52 do not contact with each other, and the device fails to be correctly formed.

In the structure shown in FIG. 4, the through hole 63 is displaced transversely from above the contact hole 62 in the source-drain direction. This displacement narrows the width d of the under layer wiring 51 in the upper portion between the source and the drain. This narrower width causes a resistance increase of the under layer wiring. The narrower width increases current density, if compared at the same device size, and the increased current density causes electromigration of the metal wiring when large current lows. To solve this problem, the transverse width of the device to the current direction should be increased, which decreases design freedom of the device layout. Even if one wants to shorten device frequency, that is source-drain spacing, the device frequency will be determined according to the design rules of the under metal wiring, the contact hole and the through hole, since the through hole 63 is located in the source-drain direction. In so far as the pattern of the under layer wiring is concerned, though the width d is the most influenced, width in the other direction is also influenced.

In view of the foregoing, an object of the present invention is to provide a lateral type field effect transistor, comprised of source regions and drain regions formed in a surface layer of a semiconductor substrate, which transistor facilitates reducing resistance of under layer wiring connected to the source region by securing width and area of the under layer wiring, increasing design freedom of the device layout and realizing smaller device pitch.

SUMMARY OF THE INVENTION

The object of the present invention is achieved by a lateral type field effect transistor that includes a source region and a drain region formed in a surface layer of a semiconductor substrate, source region under layer wiring connected to the source region through a source region contact hole formed through insulative film, drain region under layer wiring connected to the drain region through a drain region contact hole formed through the insulative film, and upper layer wiring connected to the source region under layer wiring or the drain region under layer through a through hole formed through inter-layer insulation film formed on the source region under layer wiring and the drain region under layer wiring, in which transistor the first direction connecting the through hole with said source region contact hole or the drain region contact hole crosses the second direction connecting the source region contact hole with the drain region contact hole at an angle.

It is preferable that the source region contact hole and the drain region contact hole are located on lattice points of a square lattice, and the first direction crosses at 45° the second direction.

It is also preferable that the source region contact hole or the drain region contact hole is located on lattice points of a hexagonal lattice, the drain region contact hole or the source region contact hole is located on a center of the hexagonal lattice, and the first direction crosses at 35° the second direction.

And it is also preferable that the source region and the drain region are respectively aligned in parallel stripes, and the through hole and the drain region contact hole or the source region contact hole are aligned in a stripe in which the drain region is aligned.

By locating the inter-layer insulation film through hole, which is displaced from right above the drain region contact hole for connecting the under layer wiring and the drain region, in the other directions than the direction of the drain region contact hole to the source region contact hole, spacing limitation of the source region under layer wiring on the drain side is reduced, and width or area of the under layer wiring is expanded. Further reduction of ON-resistance becomes possible by the reduction of the device area or expansion of the width of the source region under layer wiring. The present lateral type field effect transistor reduces electro-migration of the dopants, expands the device design freedom and facilitates obtaining a device with smaller size.

BRIEF DESCRIPTION OF THE DRAWINGS

The invention will be described in greater detail with reference to certain preferred embodiments thereof and the accompanying drawings, wherein:

FIGS. 1(a) and 1(b) show a first embodiment of a lateral type FET, in which FIG. 1(a) is a perspective plan view from which an upper structure is eliminated, and FIG. 1(b) is a sectional view taken along A—A of FIG. 1(a);

FIGS. 2(a) and 2(b) show a lateral type FET according to the prior art, in which FIG. 2(a) is a perspective plan view from which an upper structure is eliminated, and FIG. 2(b) is a sectional view taken along B—B of FIG. 2(a);

FIGS. 4(a) and 4(b) show another lateral type FET according to the prior art, in which FIG. 4(a) is a perspective plan view from which an upper structure is eliminated, and FIG. 4(b) is a sectional view taken along C—C of FIG. 4(a);

DETAILED DESCRIPTION OF THE PREFERRED EMBODIMENTS

Figure 2A:
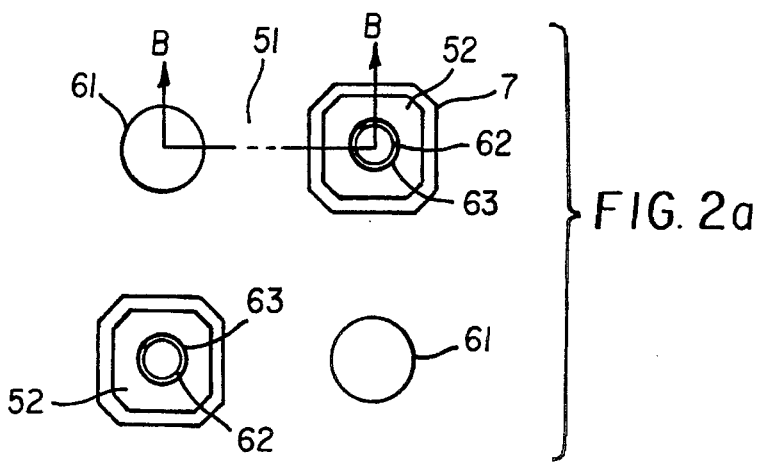
Figure 2B:
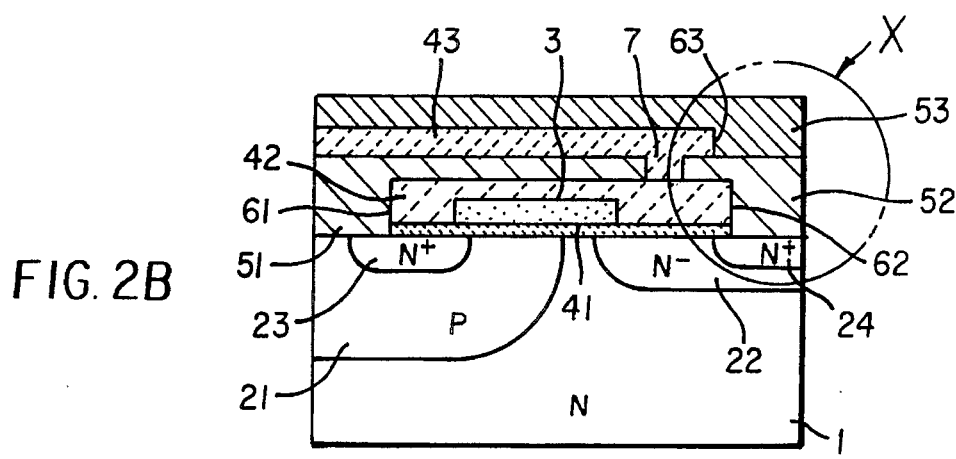
Figure 3:
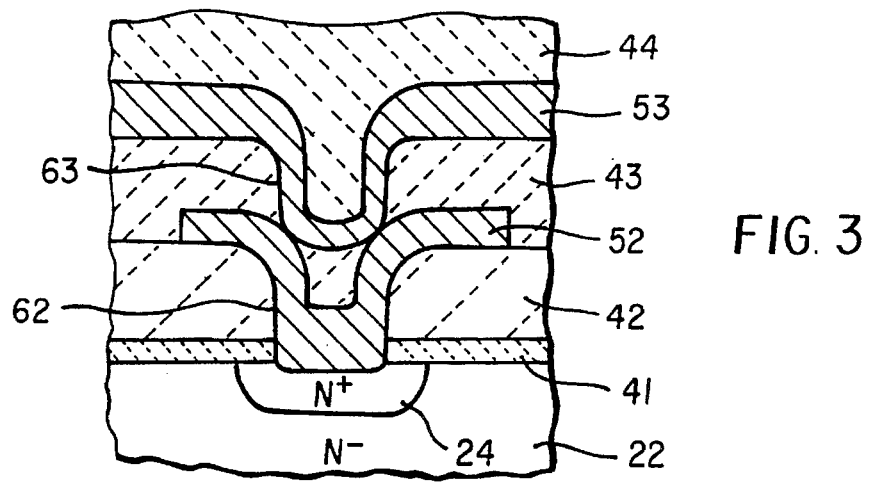
FIG. 3 is an expanded view showing an enlarged X portion of FIG. 2(b)
Figure 4A:
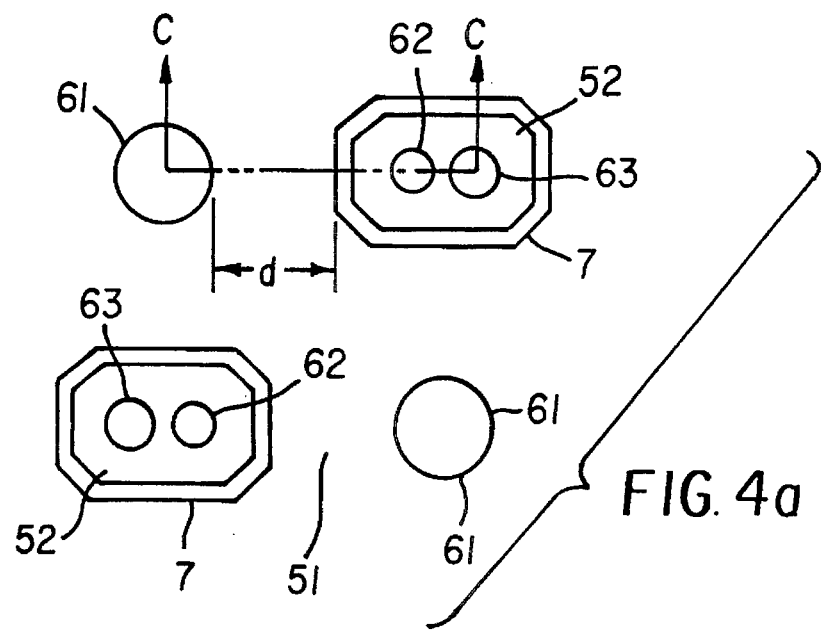
Figure 4B:
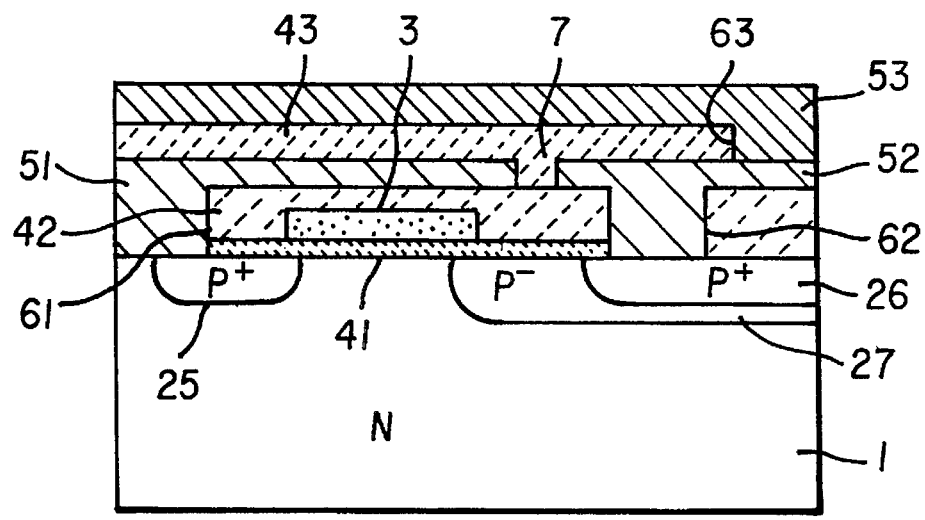

The present invention will now be described in detail hereinafter with reference to the accompanied drawings which illustrate preferred embodiments of the present invention. Throughout the drawings, same parts with those in FIGS. 2 to 4 are designated by the same reference numerals.

FIGS. 1(a) and 1(b) show an embodiment of a lateral type DMOS structure, wherein FIG. 1(b) is a sectional view taken along A—A of FIG. 1(a) and shows an N-type epitaxial layer 1, with resistivity of 3 Ω·cm and thickness of about 4 μm, is formed on a P-type substrate 11 via an N+ buried layer 12. A P-type base region 21 with surface concentration of around $10^{17}/cm^3$ is formed from the surface by ion implantation, and an N+ source region 23 is formed in the N-type drain region 21. An N-type drain region 22 with surface concentration of around $10^{17}/cm^3$ is formed from the surface by ion implantation, and an N− drain region 22 is formed in the P-type base region 21. A surface area between the source region 23 and the N-type drain region 22 is covered with oxide gate film 41 with thickness of several hundreds Å. A gate electrode 3 is formed over the oxide gate film 41 and oxide field film 45 is formed by depositing and patterning a polycrystalline silicon layer of several hundreds Å in thickness. Source side under layer Al wiring 51 is formed which short-circuits the N+ source region 23 and P-type base region 21 in a contact hole 61 formed through insulation film 42 which covers the electrode 3. Drain side under layer Al wiring 52 is formed which contacts with the N+ drain region 24 in a contact hole 62 formed through the insulation film 42. A device frequency of this LSI is 7.9 μm. As a perspective plan view FIG. 1(a) shows, in which only the source and the drain contact holes 61 and 62, a through hole 63, and under layer Al wiring 51, 52 are illustrated, the source and the drain are formed one by the other on neighboring lattice points of a 7.9 μm×7.9 μm square lattice. The area of the drain contact hole 62 is the minimum design rule of 2.3 μm². The through hole 63, with the minimum design rule of 2.3 μm², of inter-layer insulation film 43 is separated by 1.2 μm in the direction tilting by 45° over the source-drain direction. When the through hole is formed in the source-drain direction as shown in FIG. 4(a), 10 μm is necessary for the source-drain pitch, if areas of the contact holes 61, 62, overlapping of the under layer Al wiring, spacing 7 between the under layer Al wiring, and an area of the through hole 63 are considered. Therefore, this embodiment reduces device area by 37% according to which ON-resistance of the device is reduced almost by the same ratio.

Figure 5:
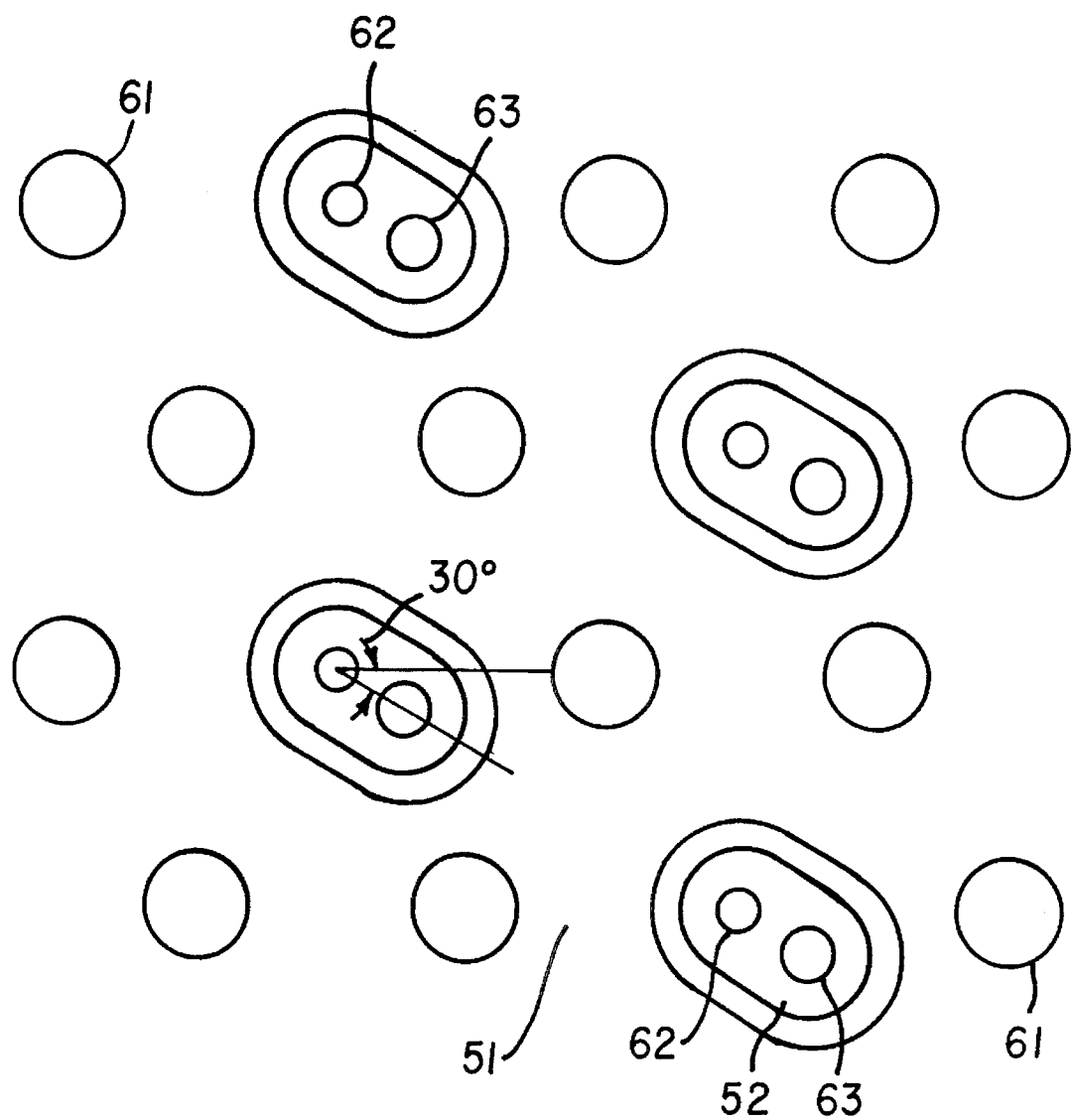
FIG. 5 is a perspective plan view of a second embodiment of a lateral type FET, from which an upper structure is eliminated.

In the second embodiment shown in FIG. 5, a source region is located on a lattice point of a hexagonal lattice and a drain region is located on the center of the hexagonal lattice: a drain region contact hole 62 is located at the center of six source region contact holes 61. A through hole 63 of the inter-layer insulation film is located tilting by 30° over the source-drain direction. This configuration is suitable to reduce ON-resistance since the configuration facilitates widening the area of the source side under layer Al wiring 51 in comparison with the first embodiment of FIG. 1 and reducing the resistance of the source side under layer Al wiring. The second embodiment reduces the device width transverse to the current flow direction, which should be set to prevent electro-migration of the dopant, and increases the design freedom.

Figure 6:
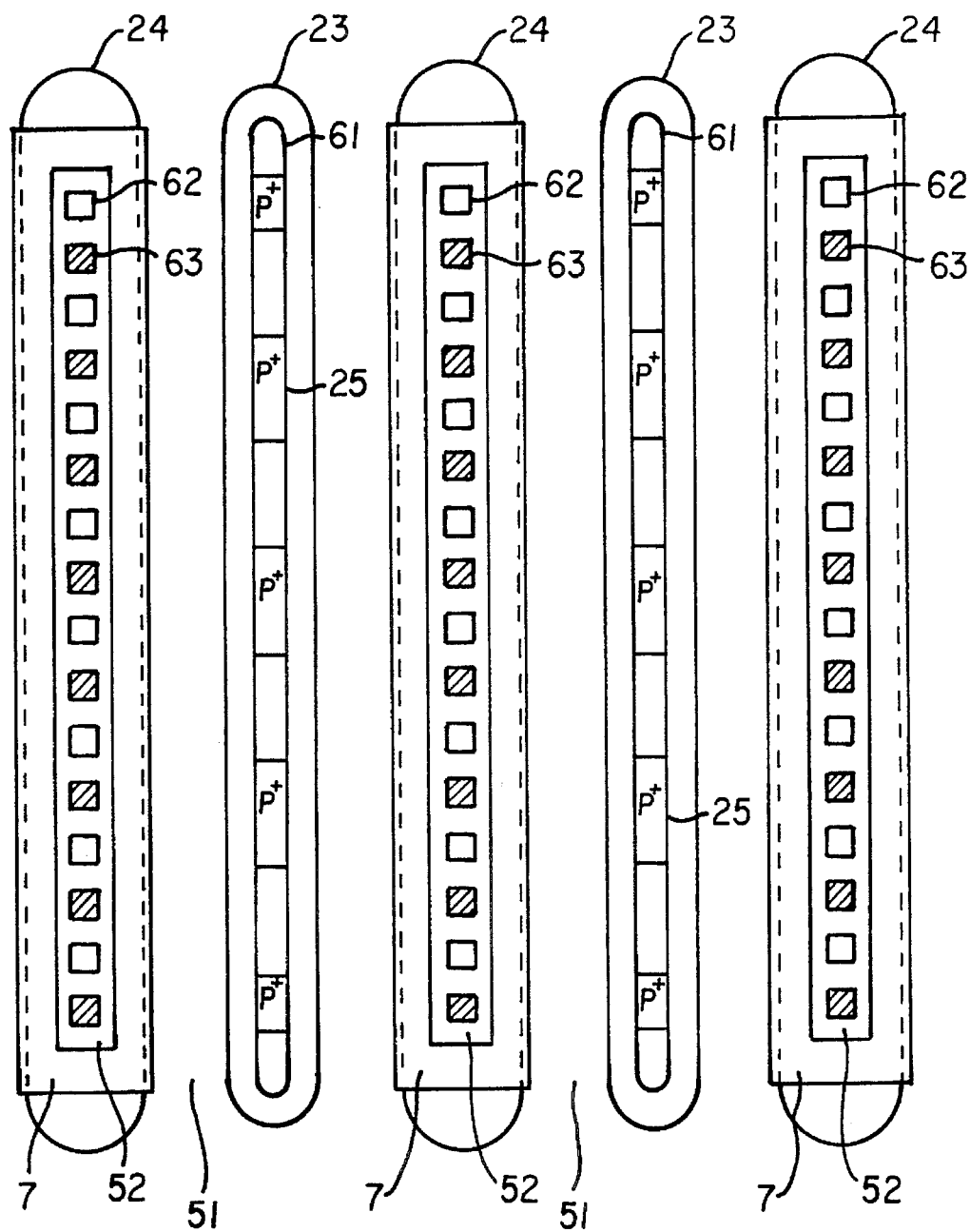
FIG. 6 is a perspective plan view of a third embodiment of a lateral type FET, from which an upper structure is eliminated.

In the third embodiment shown in FIG. 6, a source region 23 and a drain region 24 are formed in parallel stripes. A P+ contact region 25 for short-circuiting an N-type source region and a P-type base region is exposed to a contact hole 61 as is disclosed in the Japanese Laid Open Patent Publication No. H02-154469. Contact holes 62 and inter-layer insulation film through hole 63 aligned in the drain region 24 are arranged perpendicularly to the contact hole 61 to the source region 23. This arrangement doubles the width of the under layer Al wiring and reduces the resistance of the under layer wiring by 50% to lower the ON-resistance. The third embodiment reduces the transverse device width necessary for preventing the dopants from migration by 50% and increased design freedom of device layout accordingly.

It is obvious that the same effect is obtained when the drain region and the source region described above and in the drawing figures are inter-changed with each other.

According to the present invention, by locating the inter-layer insulation film through hole, which is displaced from right above the drain region contact hole for connecting the under layer wiring and the drain region, in the other directions than the direction of the drain region contact hole to the source region contact hole, spacing limitation of the source region under layer wiring on the drain side is reduced, and width or area of the under layer wiring is expanded. Thus, further reduction of ON resistance becomes possible by the reduction of the device area or expansion of the width of the source region under layer wiring. The present invention expands the device design freedom and facilitates obtaining a device with smaller size.

The invention has been described with reference to certain preferred embodiments thereof. It will be understood, however, that modifications and variations are possible within the scope of the appended claims.

What is claimed is:

1. A lateral type field effect transistor, comprising:

a source region and a drain region formed in a surface layer of a semiconductor substrate;

source region under layer wiring connected to said source region through a source region contact hole formed through an insulative film;

drain region under layer wiring connected to said drain region through a drain region contact hole formed through said insulative film; and upper layer wiring connected to at least one of said source region under layer wiring and said drain region under layer wiring through a through hole formed through an inter-layer insulation film formed on said source region under layer wiring and said drain region under layer wiring;

wherein a first direction connecting said through hole with at least one of said source region contact hole and said drain region contact hole crosses a second direction connecting said source region contact hole with said drain region contact hole at an angle.

2. The lateral type field effect transistor as claimed in claim 1, wherein said source region and said drain region are respectively located in parallel strips, and said through hole and said drain region contact hole are aligned in the strip in which said drain region is located.

3. The lateral type field effect transistor as claimed in claim 1, wherein said source region and said drain region are respectively located in parallel strips, and said through hole and said source region contact hole are aligned in the strip in which said source region is located.

4. A lateral type field effect transistor, comprising:

a source region and a drain region formed in a surface layer of a semiconductor substrate;

source region under layer wiring connected to said source region through a source region contact hole formed through an insulative film;

drain region under layer wiring connected to said drain region through a drain region contact hole formed through said insulative film; and upper layer wiring connected to at least one of said source region under layer wiring and said drain region under layer wiring through a through hole formed through an inter-layer insulation film formed on said source region under layer wiring and said drain region under layer wiring;

wherein a first direction connecting said through hole with at least one of said source region contact hole and said drain region contact hole crosses a second direction connecting said source region contact hole with said drain region contact hole at an angle wherein said source region contact hole and said drain region contact hole are located on lattice points of a square lattice, and the angle between said first and the second directions is 45°.

5. A lateral type field effect transistor, comprising:

a source region and a drain region formed in a surface layer of a semiconductor substrate;

source region under layer wiring connected to said source region through a source region contact hole formed through an insulative film;

drain region under layer wiring connected to said drain region through a drain region contact hole formed through said insulative film; and upper layer wiring connected to at least one of said source region under layer wiring and said drain region under layer wiring through a through hole formed through an inter-layer insulation film formed on said source region under layer wiring and said drain region under layer wiring;

wherein a first direction connecting said through hole with at least one of said source region contact holes and said drain region contact hole crosses a second direction connecting said source region contact hole with said drain region contact hole at an angle, wherein at least one of said drain region contact hole and said source region contact hole is located on a center of a hexagonal lattice, and wherein the angle between said first and the second directions is 30°.

6. A lateral type field effect transistor, comprising:

a source region and a drain region formed in a surface layer of a semiconductor substrate;

source region under layer wiring connected to said source region through a source region contact hole formed through an insulative film;

drain region under layer wiring connected to said drain region through a drain region contact hole formed through said insulative film; and upper layer wiring connected to said drain region under layer wiring through a through hole formed through an inter-layer insulation film formed on said source region under layer wiring and said drain region under layer wiring;

wherein a first direction connecting said through hole with said drain region contact hole crosses a second direction connecting said source region contact hole with said drain region contact hole at an angle.

7. The lateral type field effect transistor as claimed in claim 6, wherein said source region contact hole and said drain region contact hole are located on lattice points of a square lattice, and the angle between said first and the second directions is 45 degrees.

8. The lateral type field effect transistor as claimed in claim 6, wherein said source region contact hole is located on lattice points of a hexagonal lattice, said drain region contact hole is located on a center of said hexagonal lattice, and the angle between said first and the second directions is 30 degrees.

9. The lateral type field effect transistor as claimed in claim 6, wherein said source region and said drain region are respectively located in parallel strips, and said through hole and said drain region contact hole are aligned in the strip in which said drain region is located.

10. A lateral type field effect transistor, comprising:

a source region and a drain region formed in a surface layer of a semiconductor substrate;

source region under layer wiring connected to said source region through a source region contact hole formed through an insulative film;

drain region under layer wiring connected to said drain region through a drain region contact hole formed through said insulative film; and upper layer wiring connected to said source region under layer wiring through a through hole formed through an inter-layer insulation film formed on said source region under layer wiring and said drain region under layer wiring;

wherein a first direction connecting said through hole with said drain region contact hole crosses a second direction connecting said source region contact hole with said drain region contact hole at an angle.

11. The lateral type field effect transistor as claimed in claim 10, wherein said source region contact hole and said drain region contact hole are located on lattice points of a square lattice, and the angle between said first and the second directions is 45 degrees.

12. The lateral type field effect transistor as claimed in claim 10, wherein said drain region contact hole is located on lattice points of a hexagonal lattice, said source region contact hole is located on a center of said hexagonal lattice, and the angle between said first and the second directions is 30 degrees.

13. The lateral type field effect transistor as claimed in claim 10, wherein said source region and said drain region are respectively located in parallel strips, and said through hole and said source region contact hole are aligned in the strip in which said source region is located.

* * * * *